(12) United States Patent
Boll et al.

(10) Patent No.: US 6,291,971 B1
(45) Date of Patent: Sep. 18, 2001

(54) METHOD AND APPARATUS FOR DETERMINING THE CHARGE BALANCE OF A STORAGE BATTERY FOR AN OPERATING SYSTEM HAVING A PLURALITY OF ELECTRICAL CONSUMERS

(75) Inventors: Wolf Boll, Weinstadt; Bernd Falkenmayer, Schwieberdingen; Matthias Schorpp, Esslingen, all of (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/427,691

(22) Filed: Oct. 27, 1999

(30) Foreign Application Priority Data

Oct. 27, 1998 (DE) .............................. 198 49 493

(51) Int. Cl.$^7$ .................................................. H01M 10/44
(52) U.S. Cl. ............................................ 320/116; 320/132
(58) Field of Search .................................... 320/116, 118, 320/120, 139, 141, 132, 149, DIG. 21

(56) References Cited

U.S. PATENT DOCUMENTS 5,726,551 * 3/1998 Miyazaki et al. ................. 320/119 X

FOREIGN PATENT DOCUMENTS

| 31 42 038 A1 | 10/1981 | (DE) . |
|---|---|---|
| 35 20 985 A1 | 6/1985 | (DE) . |
| 41 12 987 A1 | 4/1991 | (DE) . |
| 42 41 012 A1 | 12/1992 | (DE) . |
| 196 37 574 A1 | 9/1996 | (DE) . |
| 55-16411 | 2/1980 | (JP) . |
| 1-75884 | 5/1989 | (JP) . |
| 5-66250 | 3/1993 | (JP) . |

* cited by examiner

*Primary Examiner*—Edward H. Tso
(74) *Attorney, Agent, or Firm*—Crowell & Moring LLP

(57) ABSTRACT

In a method for detecting the charge balance of a storage battery for an electric drive vehicle by measuring and summing the charge and discharge currents over time, a plurality of current measuring arrangements are provided. Individual electrical power consumers are each assigned to one of these current measuring arrangements, and the currents detected by the current measuring arrangements are added over time. The consumers are assigned mainly on the basis of their power draws. It is also possible to replace one or more current measuring arrangements by a pulse generator. The power draw of the corresponding consumer is then multiplied by its operating time, determined with a given factor. The current draw of the electric drive is measured in any case.

23 Claims, 3 Drawing Sheets

METHOD AND APPARATUS FOR DETERMINING THE CHARGE BALANCE OF A STORAGE BATTERY FOR AN OPERATING SYSTEM HAVING A PLURALITY OF ELECTRICAL CONSUMERS

BACKGROUND AND SUMMARY OF THE INVENTION

This application claims the priority of German patent document 198 49 493.9, filed Oct. 27,1998, the disclosure of which is expressly incorporated by reference herein.

The present invention relates to a method and apparatus for detecting the charge balance of storage batteries by summing the charging and discharging currents over time.

In known methods of this kind, the current is measured to determine the charge balance of storage batteries of a vehicle with electric drive. This current is added up or accumulated over time, for example by an integrator circuit. A procedure of this kind is described for example in German patent documents DE 31 42 038 A1 and DE 35 20 985 A1, in which the currents are detected with their proper signs and a charge and discharge balance is generated.

German patent document DE 41 12 987 A1 also utilizes a current measurement. It is mentioned as advantageous in this regard that a frequency can be generated corresponding to the current load on the battery by means of a current-frequency converter even for several consumers. The frequency in turn generates clock pulses that can be added up with their proper signs in order to determine a charge balance for the battery.

It is also known to provide a pulse generator which delivers pulses at certain time intervals, preferably for those consumers that exhibit constant current consumption when they are switched on and which are operated by a storage battery arrangement. By means of the pulse generator, the operating times of the individual consumers can be determined. Since the load current is also known during this time, the charge balance can also be determined as a result of the constant nature of the load current in the respective consumers if the storage battery arrangement is charged with a known charge current. The quantity of charge removed and the quantity of charge supplied are also determined. See for example German patent document DE 41 12 987 A1 in which individual discharge counting frequencies are assigned to the individual consumers when they are in the "ON" state.

For the sake of completeness, mention should also be made of German patent document DE 196 37 574 A1 which teaches the determination of the charge state of a storage battery by evaluating the terminal voltage of the battery. The temperature must also be taken into account. See, for example, German patent document DE 42 41 012 A1 in which the charge balance is determined by evaluating the terminal voltage of the storage battery. In this case also, the temperature must be taken into account.

One object of the present invention is to improve the accuracy of the charge balance in a vehicle with electric drive.

This goal is achieved by the charge balance detection method and apparatus according to the invention in which several current measuring arrangements are provided. Each of the individual electrical consumers is assigned to one of these current measuring arrangements, and the currents detected by the current go measuring arrangements are added over time.

Each current measuring arrangement has a measurement error which is determined essentially by the maximum current that it can detect. According to the invention, the consumers are assigned to different current measuring arrangements so that the load currents of the individual consumers are determined by the current measuring arrangements to which these consumers are assigned. In this manner load components which consume only a small current can be measured by instruments which are designed to measure small currents, and accordingly, generate a small measurement error, while load components which draw a large current are assigned to measuring instruments with a large current capacity.

For example, the electric drive has a power draw that is well into the kW range, with a comparably high associated current. The other electrical consumers on the vehicle for the most part exhibit consumption that is less than 1 kW. This is true for example for the lighting of the vehicle and an electric rear window heater that still rank with the highest electrical consumers in a vehicle. These consumers which have a power draw of several hundred watts can only be switched on when the vehicle is running.

Other consumers in the vehicle, that have a power draw in the range of several watts, are constantly active. This is true for example for a central locking system which can also be designed to be remote-controlled, or for a theft warning device.

Problems with creating a charge balance can be avoided by the method according to the invention. Such problems can occur in known devices under different operating conditions of the vehicle. When creating a charge balance with only a single current measuring arrangement, the latter must be designed so that currents can be measured at power levels within a range of several kW. This requirement can cause a corresponding measurement error; for example, when the vehicle is parked for a long interval. In such circumstances, an erroneous charge balance determination can occur because the measured currents, which correspond to a power draw of only a few watts, are below the margin of error of the current measuring arrangement. If the user of the vehicle, for example, goes on vacation without the vehicle and therefore leaves the vehicle parked for several weeks, the consumers mentioned, which are active even when the vehicle is parked, cause a non-negligible discharge of the storage battery system. When the charge balance has been erroneously determined, the storage battery arrangement can drain completely.

Advantageously, therefore, according to the invention the consumers are assigned to different current measuring arrangements corresponding to their respective power draw (which essentially corresponds to the current draw), so that the measurement errors of the current measuring arrangements are adapted to the rated currents of the individual consumers. This allocation by power draw correlates fully with whether the consumers can be activated only when the vehicle is being driven, or can be activated even when the vehicle is parked. Such an allocation of the consumers also creates a situation in which the respective current measuring arrangements are energized in accordance with the operating state of the vehicle that can be detected optimally from the measurement error standpoint.

When the vehicle is being driven, the charge balance is determined essentially by the power draw of the electric drive. In addition, the charge balance is also correctly determined in the phases in which the vehicle is at rest. This has an advantageous effect especially during longer parking times for the vehicle.

In an advantageous embodiment of the invention, two current measuring arrangements are provided, with the electric drive being assigned to one of the current measuring arrangements, and the other consumers assigned to the other current measuring arrangement. In this way, an allocation of the consumers is obtained in which those consumers whose power draw lies in the kW range are assigned to one current measuring arrangement, and the power draw of the remaining consumers is detected by means of the other current measuring arrangement which reaches up to approximately 1 kW per consumer. In known methods for determining charge balances, it has been shown that a charge balance with sufficient accuracy can be determined in this way.

In another embodiment of the invention, two current measuring arrangements are provided, with one current measuring arrangement having assigned to it, in addition to the electric drive, those consumers that can be activated only while the vehicle is operating; and the other current measuring arrangement having allocated to it those consumers that are active or can be activated even when the vehicle is at rest.

As already described, during driving the charge balance is determined essentially by the power draw of the electric drive. Since the measurement error of this current measuring arrangement also enters into the charge balance, the error does not increase when the power draw of consumers in which there is an otherwise unfavorable signal/noise ratio is also included by means of this current measuring arrangement. Since the power draw of the consumers that are active or can be activated while the vehicle is at rest is detected by a separate current measuring arrangement, the charge balance is determined with improved accuracy even during long periods when the vehicle is not operating. It turns out to be advantageous that the bandwidth of the power draw of the consumers that are active or can be activated while the vehicle is at rest is very small and typically in the range of several watts. The maximum current that can be determined by this current measuring arrangement is also comparatively limited, which in turn has an advantageous effect on the error. Since this error can be reduced, the charge balance is determined with improved accuracy especially while the vehicle is at rest for long periods of time.

In still another embodiment having two current measuring arrangements, the electric drive and an electrically driven air conditioner compressor of an air conditioner are assigned to one current measuring arrangement, while the other consumers assigned to the other current measuring arrangement. In this case, the air conditioner is not driven by the engine, via a V belt, and the power draw of the compressor of the air conditioner is typically on the order of several kW. It is therefore advantageous to detect this power draw with the current measuring arrangement of the electric drive if this air conditioner compressor is driven directly and electrically.

According to still another embodiment of the invention, at least one current measuring arrangement is provided, together with at least one pulse generator, which delivers impulses at cyclic intervals. The individual electrical consumers are assigned either to the (at least one) current measuring arrangement or to the pulse generator, and the currents are detected by the at least one current measuring arrangement. The latter are added over time, and are added to the pulses of the pulse generator, with the pulses of the pulse generator being multiplied by a factor prior to addition. The factor is determined by the "ON" time of the individual consumers assigned to the pulse generator, as well as their power draws.

The power draw of the electric drive cannot be detected by a pulse generator because it is subject to sharp fluctuations. Consequently, the power draw differs from the power draw of other consumers which, during the time when they are switched on, draw an at least approximately constant current, such as is true for example of the rear window heater of the vehicle.

According to another feature of the invention, a second current measuring arrangement can be dispensed with. This turns out to be particularly advantageous if the method is to be performed by a microcomputer. For evaluating the data, this microcomputer must be real-time-capable. Consequently, there is already a pulse generator available in the microcomputer.

In still another embodiment of the invention, a current measuring arrangement is provided, with the electric drive being assigned as a consumer to the current measuring arrangement and the other consumers being assigned to the pulse generator. As a result, the accuracy of the charge balance is improved because when the vehicle is operating, the charge balance is determined essentially by the power draw of the electric drive.

In yet a further embodiment, both the electric drive and those consumers that can be activated only when the vehicle is being driven are allocated to a current measuring arrangement. Those consumers that are active or can be activated when the vehicle is at rest, on the other hand, are assigned to a pulse generator.

As noted previously, during the operationally ready time of the vehicle, the charge balance is determined essentially by the power draw of the electric drive. Therefore, this error does not increase when the power draw of the consumer is detected by means of this current measuring arrangement, provided said consumers can be activated only during the operation of the vehicle. Accordingly, the consumers that are active or can be activated only when the vehicle is at rest are assigned to the pulse generator. It also turns out to be advantageous that the power draw of these consumers is largely constant and this applies for example to a theft warning device or a central locking system in standby operation. In this way, the power draw of these consumers can be simulated well by a pulse generator. A second current measuring arrangement can therefore be dispensed with. Advantageously, the current draw of consumers whose current draw can be varied essentially continuously (for example, a blower in the ventilating system) are detected by means of the current measuring arrangement so that problems with determining the factor are avoided.

In still another embodiment of the invention, the electric drive and an electrically driven air conditioner compressor of an air conditioning system are assigned to one of the current measuring arrangements, and the other consumers are assigned to a pulse generator.

This embodiment relates to a design of the vehicle in which the air conditioner compressor is driven not by the engine via a V belt, but is driven directly, electrically. Advantageously, the power draw of the air conditioner compressor, in this case also, is detected by the current measuring arrangement with which the power draw of the electric drive is determined because the power draw of the air conditioner compressor lies in the kW range.

According to an additional feature of the invention, the factor is varied as a function of the switched-on and/or operating state of the consumer associated with the pulse generator. In this manner, differing power draws of the consumers that are assigned to the pulse generator can be taken into account.

The electric drive of the vehicle can apply to a vehicle that has only an electric drive or a hybrid vehicle in which another drive source is available besides the electric drive. In a hybrid vehicle, it is advantageous not to assign any additional consumers to the current measuring arrangement for determining the power draw of the electric drive, because otherwise the errors in charge balance could become too great if the vehicle is driven by the other drive source and the power draw of the other consumers is detected with a measurement error that is too high. However, it is also possible to vary the number of current measuring devices accordingly.

Other objects, advantages and novel features of the present invention will become apparent from the following detailed description of the invention when considered in conjunction with the accompanying drawings.

DETAILED DESCRIPTION OF THE DRAWINGS

Figure 1:
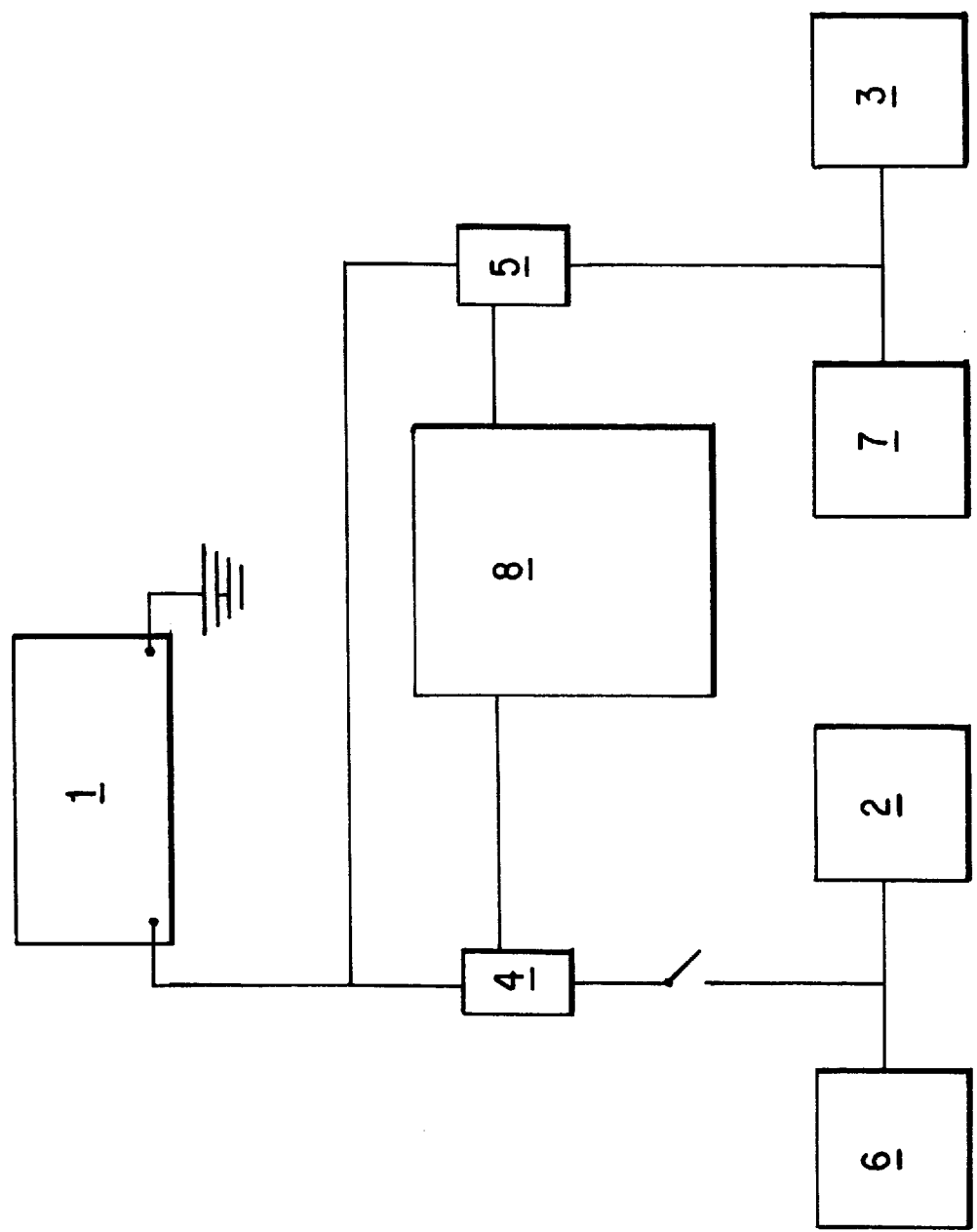
FIG. 1 illustrates a first allocation of the power consumers among the current measuring arrangements.

FIG. 1 shows a first allocation of electric power consumers (load components) 2, 3 among current measuring arrangements 4, 5. Consumers 2, 3 are supplied with electrical energy by a storage battery arrangement 1. Chargers 6 and 7 are also provided.

Consumers 2 have an increased power draw (such as, for example, the electric drive of the vehicle or other consumers which are active or can only be activated when the vehicle is driven). A charger 6 associated with these consumers 2 causes a heavy current charging of storage battery arrangement 1. The discharge currents of storage battery arrangement 1 which flow in order to operate consumer 2 are measured by current measuring arrangement 4. This current measuring arrangement 4 also measures the charging currents of charger 6. The current measuring arrangement 4 is designed for heavy current measurement.

The consumers 3, on the other hand, may include for example those consumers which are active or can be activated only when the vehicle is at rest, and which draw a comparatively small current. A charger 7 associated with these consumers 3 causes a relatively small current charging of storage battery arrangement 1. The discharge currents of the storage battery arrangement 1 that flow in order to operate consumers 3 is measured by current measuring arrangement 5. This current measuring arrangement 5 measures the charge currents of charger 7. The current measuring arrangement 5 is designed for low current measurement.

The signals of current measuring arrangements 4 and 5 can be supplied for example to a microprocessor 8, in which they can be integrated. In this way, a charge balance of storage battery arrangement 1 can be prepared. Of course, it is possible to provide only one charger, such as charger 6, in which case charger 7 is then omitted.

This division of the consumers is useful for example in a vehicle which has an electric drive as its only drive source. During driving, the current consumption is determined essentially by the current consumption of the electric drive. While the vehicle is at rest, storage battery arrangement 1 is discharged mainly by the other consumers which are then active. Even if these consumers have a current consumption that is significantly less by comparison with the electric drive, there is nevertheless a discharge of the storage battery arrangement that cannot be disregarded.

In a vehicle with a hybrid drive, it can be advantageous to provide a different allocation of the consumers, with only the electric drive constituting consumer 2. All other consumers are then represented by consumer 3.

Figure 2:
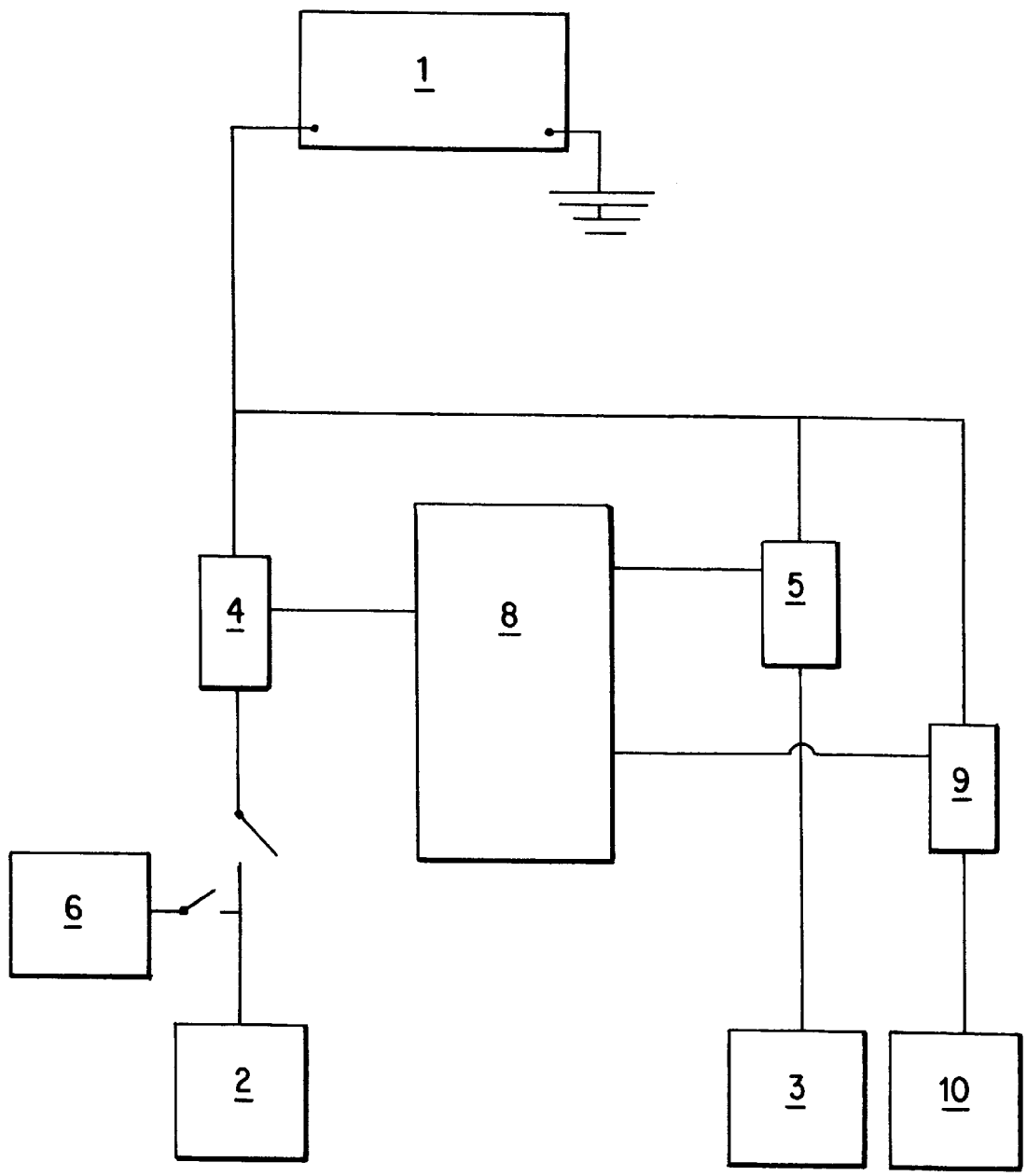
FIG. 2 illustrates another allocation of the consumers by current measuring arrangements.

As shown in FIG. 2, it is also possible to divide the power consumers into three groups. Consumer 2 represents the electric drive of the vehicle. The current measuring device 4 is designed to measure high current which, with monitoring of the terminal voltage of the storage battery arrangement, corresponds to a power of several kW. Consumers 3 are those which are active or can be activated whenever the vehicle is being driven, and whose power draw is typically on the order of several hundred watts. The current measuring arrangement 5 is therefore designed for the corresponding currents. Consumers 10 are those that are active or can be activated only while the vehicle is at rest, and have a power draw which is typically on the order of several watts. Current measuring device 9 is therefore designed for measuring weak currents. An optimum measurement of currents can be performed with this arrangement, which is especially suitable for a vehicle with a hybrid drive.

Figure 3:
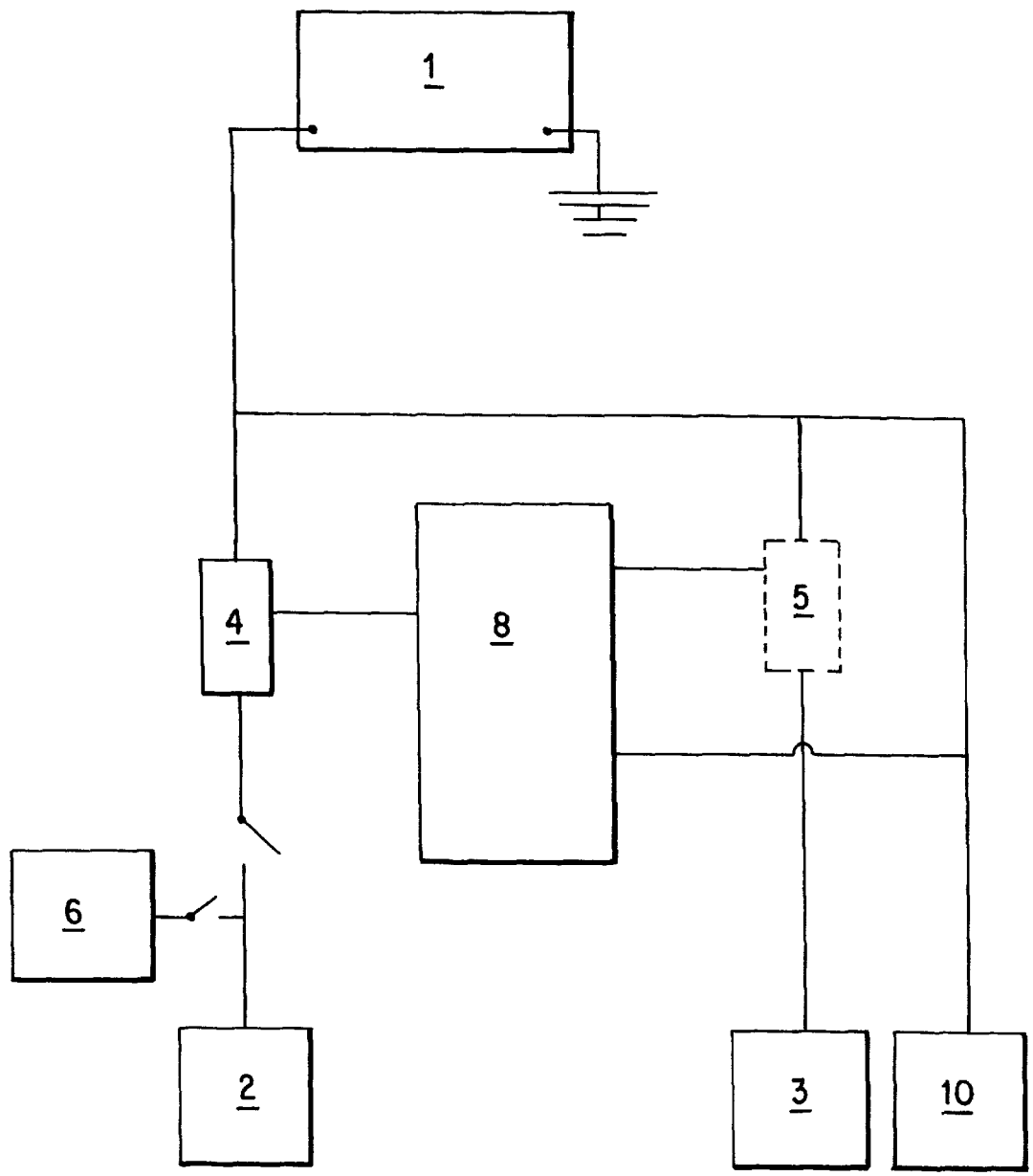
FIG. 3 shows replacement of current measuring arrangements by pulse generators.

FIG. 3 shows an arrangement corresponding to FIG. 2 in which one of the current measuring arrangements has been replaced by a pulse generator, which is part of microcomputer 8. It must therefore be determined only which of consumers 10 is switched on. Since each of these consumers 10 has a specific current requirement, the charge quantity removed from the storage battery arrangement can be determined by multiplying the operating time of the respective consumer 10 by a factor corresponding to this current requirement. The current measuring arrangement 5 can also be replaced by a version with a pulse generator.

Instead of microcomputer 8, a similar circuit design can be employed in which the signals are supplied to an integrating member by the current measuring arrangement. The integration elements in question are then supplied to a summing device.

For example, it is possible of course in the embodiment according to FIG. 1, to replace current measuring arrangement 5 by a pulse generator. There is then only one current measuring arrangement so that the cost of the parts in this embodiment can be kept within limits.

It also falls within the scope of the invention, for example, to provide a plurality of current measuring arrangements which are activated corresponding to the operating state of the vehicle. When the vehicle is at rest, for example, a current measuring arrangement is activated that is designed for weak current measurement. If the vehicle is being moved by another drive source, either the current measuring arrangement is activated that is designed for measuring weak currents or a current measuring arrangement that is designed for measuring "medium" current strengths.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. Method for determining the charge balance of a storage battery for an operating system having a plurality of electrical consumers coupled to said battery, by summing charging and discharging currents to the storage battery over time, said method comprising:

providing a plurality of current measuring arrangements for measuring values of current flow between the battery and said electrical consumers;

assigning each individual electrical consumer to respective one of the current measuring arrangements;

adding the measured values of current detected by current measuring arrangements over time to determine said charge balance.

2. The method according to claim 1, wherein the operating system is an electrically powered motor vehicle.

3. Method according to claim 2, wherein:

two current measuring arrangements are provided;

an electric drive of said vehicle is assigned as a consumer to a first current measuring arrangement; and all other consumers are assigned to a second current measuring arrangement.

4. Method according to claim 2, wherein:

two current measuring arrangements are provided;

consumers that can be activated only when the vehicle is operating, and an electric drive of said vehicle, are assigned to a first current measuring arrangement; and those consumers which are active or can be activated while the vehicle is at rest, are assigned to the second current measuring arrangement.

5. The method according to claim 2, wherein:

two current measuring arrangements are provided;

an electric drive of the vehicle is assigned to a first current measuring arrangement, together with an electrically driven air conditioner compressor; and all other consumers are assigned to the second current measuring arrangement.

6. A method for determining the charge balance of a storage battery for an operating system having a plurality of electrical consumers by summing charging and discharging currents to the battery over time, said method comprising:

providing at least one current measuring arrangement, and at least one pulse generator that delivers pulses at cyclic intervals;

assigning each individual electrical consumer to a current measuring arrangement or to the pulse generator;

summing currents determined by the current measuring arrangements over time;

multiplying the pulses from the pulse generator by a factor; and combining the summed currents determined by the current measuring arrangements with multiplied pulses from pulse generator.

7. The method according to claim 6, wherein the operating system is an electrically powered motor vehicle.

8. Method according to claim 7, wherein:

an electric drive of the vehicle is assigned as a consumer to one current measuring arrangement; and all other consumers are assigned to the pulse generator.

9. Method according to claim 7, wherein:

one current measuring arrangement has assigned to it an electric drive of the vehicle and those consumers which can be activated only while the vehicle is operating; and consumers which are active or can be activated even while the vehicle is at rest are assigned to the pulse generator.

10. Method according to claim 7, wherein:

an electric drive of the vehicle and an electrically driven air conditioner compressor are assigned to one current measuring arrangement; and all other consumers are assigned to the pulse generator.

11. Method according to claim 6, wherein the factor is varied as a function of an operating state of consumers associated with the pulse generator.

12. Method according to claim 7, wherein the factor is varied as a function of an operating state of consumers associated with the pulse generator.

13. Method according to claim 8, wherein the factor is varied as a function of an operating state of consumers associated with the pulse generator.

14. Method according to claim 9, wherein the factor is varied as a function of an operating state of consumers associated with the pulse generator.

15. Method according to claim 10, wherein the factor is varied as a function of an operating state of consumers associated with the pulse generator.

16. Apparatus for determining the state of charge of a storage battery for an operating system having a plurality of electrical load components, comprising:

first current measurement device for determining and accumulating over time a sum of currents flowing to a first group of said load components;

a second current measurement device for determining and accumulating over time a sum of currents flowing to a second group of said load components; and means for adding accumulated currents determined by said first and second current measurement devices.

17. Apparatus for determining the state of charge of a storage battery for an operating system according to claim 16, wherein said first group consists of load components which consume relatively greater amounts of current and said second group consists of load components which consume relatively smaller amounts of current.

18. Apparatus for determining the state of charge of a storage battery for an operating system according to claim 17, wherein said first group of load components includes at least one of an electric drive of said motor vehicle and an electrically driven air conditioner compressor.

19. Apparatus for determining the state of charge of a storage battery for an operating system according to claim 18, wherein said second group includes load components which can be activated without regard to an operating state of the vehicle.

20. Apparatus for determining the state of charge of a storage battery for an operating system according to claim 17, wherein said first and second current measurement devices also determine and accumulate charging currents flowing to said battery from at least one electrical generator.

21. The method according to claim 1, wherein said step of assigning comprises assigning each individual electrical consumer to one of the current measuring arrangements, based on a magnitude of power consumption of each electrical consumer.

22. The method according to claim 6, wherein said step of assigning comprises assigning each individual electrical consumer to one of the current measuring arrangements, based on a magnitude of power consumption of each electrical consumer.

23. The apparatus according to claim 16, wherein each load component is assigned to said first group of load components or to said second group of load components, based on a magnitude of its power consumption.

* * * * *